United States Patent
Thazhatheppattu et al.

(10) Patent No.: US 9,625,938 B2
(45) Date of Patent: Apr. 18, 2017

(54) INTEGRATED DIFFERENTIAL CLOCK GATER

(71) Applicant: Advanced Micro Devices, Inc., Sunnyvale, CA (US)

(72) Inventors: Hariprasad Thodukattil Thazhatheppattu, Bangalore (IN); Prasant Vallur, Bangalore (IN); Animesh Sharma, Bangalore (IN)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 14/668,183

(22) Filed: Mar. 25, 2015

(65) Prior Publication Data

US 2016/0285437 A1 Sep. 29, 2016

(51) Int. Cl.
*H03K 3/356* (2006.01)
*G06F 1/10* (2006.01)
*H03K 3/037* (2006.01)

(52) U.S. Cl.
CPC ............ *G06F 1/10* (2013.01); *H03K 3/0372* (2013.01)

(58) Field of Classification Search
USPC ................ 327/199, 201, 208, 210, 212–214
See application file for complete search history.

(56) References Cited

U.S. PATENT DOCUMENTS

| | | | | |
|---|---|---|---|---|
| 5,654,658 | A * | 8/1997 | Kubota | H03K 3/037 327/202 |
| 5,905,393 | A * | 5/1999 | Rinderknecht | H03K 3/356121 327/202 |
| 9,154,291 | B2 * | 10/2015 | Yamaguchi | H04L 7/00 |
| 9,219,470 | B1 * | 12/2015 | Venditti | H03K 5/1565 |
| 2002/0190771 | A1 * | 12/2002 | Tran | H03K 3/35625 327/215 |
| 2016/0093346 | A1 * | 3/2016 | Hoff | H03K 3/356104 365/189.11 |

* cited by examiner

*Primary Examiner* — An Luu
(74) *Attorney, Agent, or Firm* — Zagorin Cave LLP

(57) ABSTRACT

A technique implements differential digital logic circuits with a differential clock distribution network using standard cell differential clock gater circuits to reduce area, delay, power consumption in integrated circuits. An apparatus includes a first terminal configured to receive a clock signal, a second terminal configured to receive a complementary clock signal, and a third terminal configured to receive a clock control signal. The apparatus includes a latch circuit configured to generate a latched version of the clock control signal based on a version of the clock control signal, a version of the clock signal, and a version of the complementary clock signal. The apparatus includes a combinatorial circuit configured to generate a gated clock signal and a gated complementary clock signal based on the version of the clock control signal, the version of the clock signal, and the version of the complementary clock signal.

21 Claims, 5 Drawing Sheets

INTEGRATED DIFFERENTIAL CLOCK GATER

BACKGROUND

Field of the Invention

The present invention is related to integrated circuits and more particularly to clock gating circuits for clock signal distribution networks of integrated circuits.

Description of the Related Art

In general, clock generation and distribution consumes a substantial amount of power by the integrated circuit. Decreases in the power consumption of the integrated circuits included in a target portable application increases the battery life and may provide an advantage in the marketplace. Accordingly, improved techniques for reducing power consumption of a clock distribution network are desired.

SUMMARY OF EMBODIMENTS OF THE INVENTION

In at least one embodiment of the invention, an apparatus includes a first terminal configured to receive a clock signal, a second terminal configured to receive a complementary clock signal, and a third terminal configured to receive a clock control signal. The apparatus includes a latch circuit configured to generate a latched version of the clock control signal based on an inverted version of the clock control signal, a version of the clock signal, and a version of the complementary clock signal. The apparatus includes a combinatorial circuit configured to generate a gated clock signal and a gated complementary clock signal based on the latched version of the clock control signal, the version of the clock signal, and the version of the complementary clock signal. The latch circuit may include a selective pass circuit configured to pass the version of the clock control signal based on the version of the clock signal and the version of the complementary clock signal. The clock control signal may be a clock enable signal and in response to the clock control signal having a low level, the combinatorial circuit may generate the gated clock signal having a low level and the gated complementary clock signal having a high level. The clock signal and the complementary clock signal may form a differential clock signal and the apparatus may further include a current mode logic circuit coupled to the differential clock signal. The apparatus may be embodied in computer-readable descriptive form of a standard cell.

In at least one embodiment of the invention, a method includes receiving a clock signal, receiving a complementary clock signal, and receiving a clock control signal. The method includes selectively passing a version of the clock control signal according to a version of the clock signal and a version of the complementary clock signal. The method includes generating a latched version of the clock control signal based on the version of the clock control signal, the version of the clock signal, and the version of the complementary clock signal. The method includes generating a gated clock signal and a gated complementary clock signal based on the latched version of the clock control signal, the version of the clock signal, and the version of the complementary clock signal.

In at least one embodiment of the invention, an apparatus includes a skew-correcting differential clock gating circuit and a plurality of differential clock gating circuits cascaded in series. A first differential clock gating circuit of the plurality of differential clock gating circuits is coupled to the output of the skew correcting differential clock gating circuit. The apparatus may include an additional skew-correcting differential clock gating circuit coupled to the output of a last differential clock gating circuit of the plurality of differential clock gating circuits. The apparatus may include a current mode logic circuit coupled to the output of a last differential clock gating circuit of the plurality of differential clock gating circuits.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

A technique implements differential digital logic circuits and a differential clock distribution network (e.g., clock tree) using standard cell differential clock gater circuits to reduce area, delay, and power consumption and to improve noise immunity to electromagnetic interference of integrated circuit designs as compared to designs using only single-ended digital logic circuits. Exemplary differential digital logic families include current mode logic, low-voltage differential signaling (LVDS), or source coupled logic, which are typically used in high speed integrated circuits. A typical current mode logic circuit includes a current bias transistor that remains in the saturation region of operation to maintain a constant current. In general, current mode logic circuits have lower output voltage swings as compared to single-ended logic circuits.

Use of differential signaling for digital logic circuits requires providing two phases of a clock signal, e.g., a clock signal, CLK, and a complementary clock signal, CLKB, to synchronous differential circuits (e.g., flip-flops, latches, register arrays, etc.). The synchronous differential circuits use both phases of the clock signal and need matched distribution for proper operation. Any skew between CLK and CLKB must be within a specified range to ensure proper operation, relax timing closure (e.g., setup and hold times), and to reduce or eliminate overdesign that may otherwise increase power consumption and area. Rather than using a single-ended clock network that internally generates CLKB from CLK inside all sequential circuits, thereby resulting in skew between CLK and CLKB, a reduction or elimination of that clock skew may be facilitated by using a differential clock network. In addition, low signal swing clock distribution (e.g., clock distribution using signals having voltage swings less than VDD-VSS voltage swings) may be used to reduce power consumption of the clock distribution networks. Moreover, the clock distribution network may operate more efficiently with differential signals as compared to single-ended signaling.

When not switching states, the dynamic power consumption of the state elements is negligible and only leakage currents are incurred. Clock gating techniques reduce dynamic power dissipation in synchronous circuits by reducing unnecessary switching activity in state elements when they are functionally idle (e.g., in a sleep mode or other power saving mode). In general, to reduce power consumption, a clock control signal is used to allow switching of clock signals in normal functional mode and to disable switching activity of those clock signals in a functionally idle state. Although in the description below the clock control signal is a clock enable signal, one of skill in the art will appreciate that the teachings herein can be utilized with a clock control signal of opposite polarity, a clock disable signal.

Figure 1:
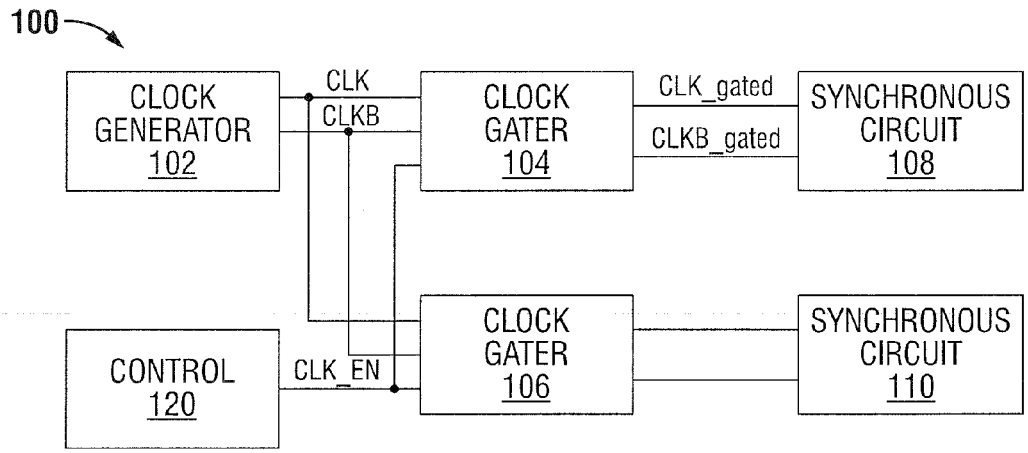
FIG. 1 illustrates a functional block diagram of an exemplary integrated circuit clock distribution network.

Referring to FIG. 1, an integrated differential clock gating technique includes clock generator 102, which provides a two phase clock, CLK and its complement, CLKB. Clock generator 102 may include an oscillator and one or more phase-locked loops configured to generate CLK and CLKB with negligible skew between corresponding clock edges. Clock gater 104 and clock gater 106 provide gated versions of CLK and CLKB under the control of CLK_EN, which is generated by control circuit 120. Control circuit 120 may generate CLK_EN to have a value that disables CLK_gated and CLKB_gated according to a power saving mode or other suitable control information that indicates that synchronous circuits 108 and 110 can be effectively disabled for switching activity. Routing provides those signals, CLK_gated and CLKB_gated, from clock gater 104 and clock gater 106 to synchronous circuit 108, and synchronous circuit 110, respectively. Note that although only one CLK_EN signal is illustrated, in other embodiments of clock distribution network 100, multiple, independent clock enable signals may be generated and provided to respective clock gater cells for independent control of corresponding synchronous circuits.

Notwithstanding the benefits of differential signaling, typical Clock-Tree-Synthesis (CTS) tools offered by Electronic Design Automation (EDA) vendors offer only single-phase clock distribution. Multi-level clock gating used for power-efficient designs is typically done using only conventional single-ended integrated clock gater cells that are available as standard digital cells. Instantiating a separate clock gater standard cell for each phase of multiple phases of a clock signal substantially increases the area and power consumption of the clock distribution network.

Figure 2:
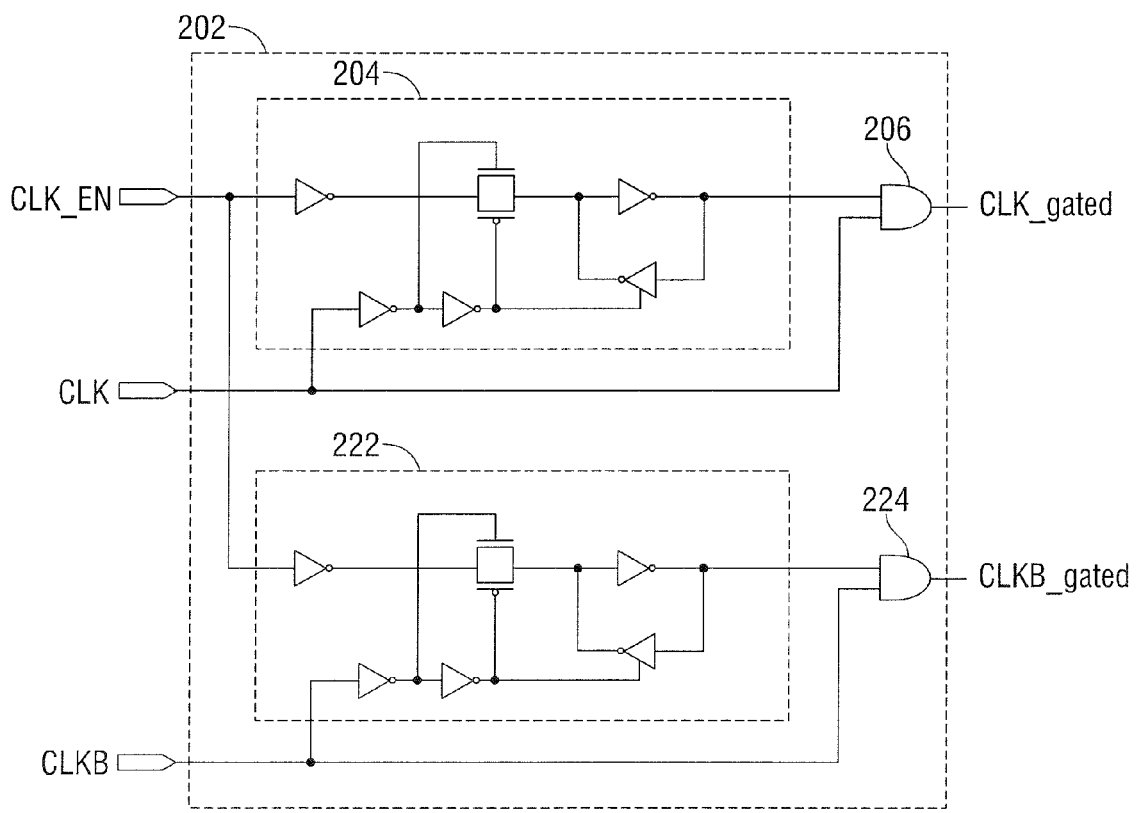
FIG. 2 illustrates a circuit diagram of a differential clock gater circuit.
Figure 3:
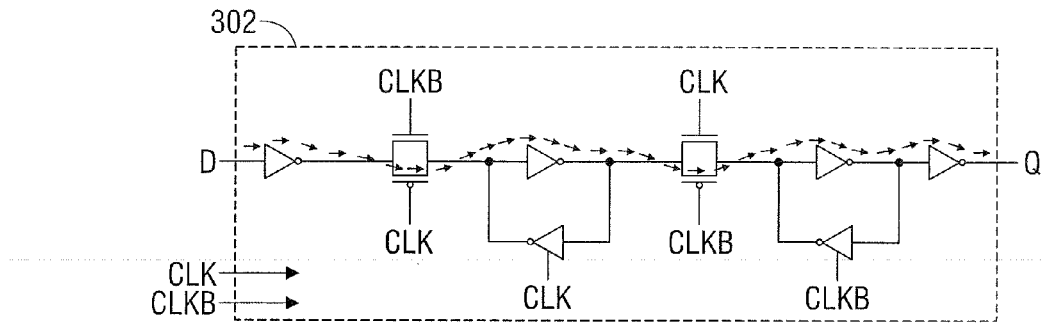
FIG. 3 illustrates a race condition in an exemplary flip-flop circuit.

Referring to FIG. 2, a technique for gating multiple clock phases includes gating each phase of the clock, e.g., CLK and CLKB separately. Each clock phase is gated as if it is a single-ended signal. Clock gater 202 includes separate latches responsive to different phases of the clock signal, latches 204 and 222, for generating CLK_gated and CLK-B_gated, respectively. When the differential clock signal is gated, e.g., when CLK_EN is low (i.e., '0'), then clock gater 202 drives both CLK_gated and CLKB_gated to a low value. As a result, a sequential element receiving CLK_gated and CLKB_gated, e.g., a flip-flop, experiences a race-through condition, as illustrated in FIG. 3. In response to CLK_gated and CLKB_gated being low, state element 302 directly transfers the input signal on data terminal D to output terminal Q, instead of being in a gated mode, i.e., a mode where the state element does not transfer data directly from input to output. A similar condition arises when a clock gater drives both CLK and CLKB to a high value when the differential clock signal is gated (e.g., when CLK_EN is low, i.e., '0').

Figure 4:
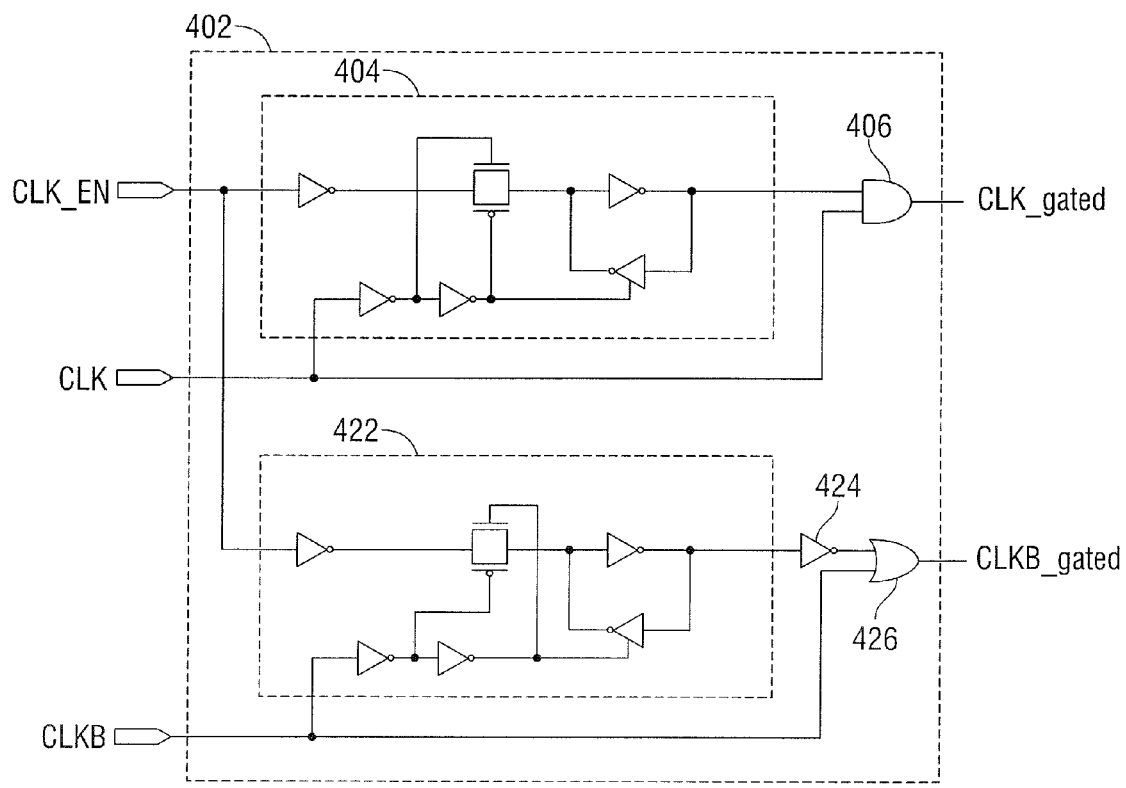
FIG. 4 illustrates a circuit diagram of a differential clock gater circuit.

A clock-gating technique that reduces or eliminates race-through conditions uses separate logic to generate each gated clock phase. The clock-gating technique ensures that CLK and CLKB are always complementary. Referring to FIG. 4, clock gater 402 ensures that the differential phases of the clock are complementary in gated mode (e.g., CLK_EN='0') and in free-running mode (e.g., CLK_EN='1'). Clock gater 402 includes latch 404 and latch 422 that separately gate CLK and CLKB, respectively. Latch 404 is configured to latch CLK_EN, which is coupled to a data input of latch 404, and is controlled by CLK, which is coupled to a control input of latch 404. Latch 422 is configured to latch CLK_EN, which is coupled to a data input of latch 422, and is controlled by CLKB, which is coupled to a control input of latch 422. The outputs of latches 404 and 422 are logically combined with CLK and CLKB, respectively, to generate corresponding gated clock signals, CLK_gated and CLKB_gated. Note that the logic on the outputs of latches 404 and 422 differs. For example, AND 406 logically combines the output of latch 404 with CLK to generate CLK_gated having a low gated-mode value, while OR 426 logically combines the inverted output of latch 422 with CLKB to generate CLKB_gated having a high gated-mode value. Clock gater 402 includes two latches and a substantial number of devices, thereby consuming substantial area and power, making it ill-suited to being incorporated into a standard cell used by synthesis and automatic place and route tools for integrated circuit designs.

Figure 5:
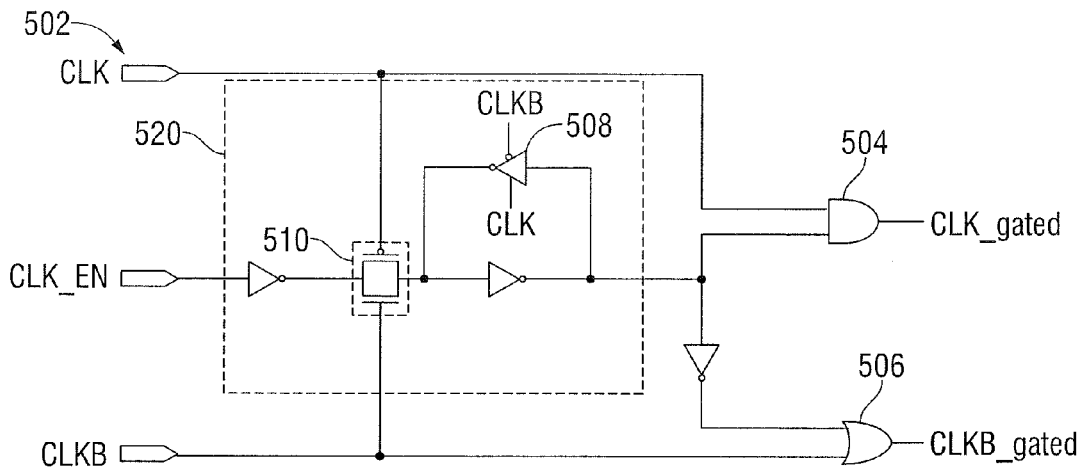
FIG. 5 illustrates a circuit diagram of an exemplary differential clock gater circuit consistent with at least one embodiment of the invention.

A differential clock gating technique suitable for a standard cell design methodology integrates the differential clock gater latches of clock gater 402 and reduces the number of devices used by the differential clock gater circuit, as well as reduces power consumption of the differential clock gater circuit as compared to the circuit topology of clock gater 402. Referring to FIG. 5, differential clock gater 502 includes two control ports that are configured to receive CLK and CLKB. The complementary clock signals control transmission gate 510 and tri-state inverter 508 of latch 520. Output combinatorial devices, e.g., AND 504 and output OR 506, logically combine CLK and CLKB with a latched version of CLK_EN and its complement, respectively, to generate the gated clock outputs according to Table 1.

TABLE 1

| Clock Gater Logic | | | | |
|---|---|---|---|---|
| CLK_EN | CLK | CLKB | CLK_GATED | CLKB_GATED |
| 1 | 1 | 0 | 1 | 0 |
| 1 | 0 | 1 | 0 | 1 |

TABLE 1-continued

Clock Gater Logic

| CLK_EN | CLK | CLKB | CLK_GATED | CLKB_GATED |
|---|---|---|---|---|
| 0 | 1 | 0 | 0 | 1 |
| 0 | 0 | 1 | 0 | 1 |

Figure 6:
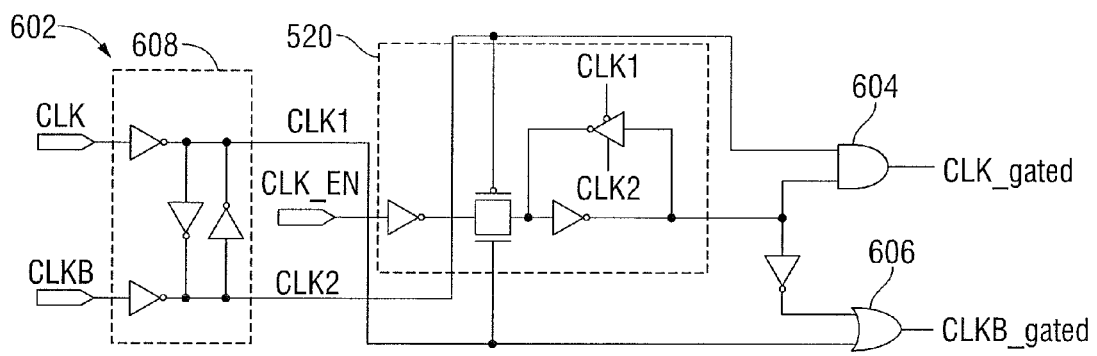
FIG. 6 illustrates a circuit diagram of a skew-correcting differential clock gater circuit consistent with at least one embodiment of the invention.

In general, a differential clock distribution network with state elements (e.g., flip-flops or latches) responsive to differential clock inputs may be sensitive to skew between the phases of the differential clock. Substantial skew may arise even when the CLK and CLKB signal paths are perfectly matched for the propagation delay, due to routing mismatches between conductive traces used to transport CLK and CLKB. Routing mismatches may occur as the result of on-chip process variation, differences in power supply voltages, crosstalk and coupling differences, etc. Substantial skew between the phases cause race-through conditions similar to that described above with regard to FIG. 3. A technique used to reduce or eliminate effects of substantial clock skew in a differential clock distribution network includes incorporating an edge alignment circuit in the clock gater to align corresponding, but opposing edges of the complementary signals. For example, referring to FIG. 6, edge alignment circuit 608 includes a cross-coupled inverter structure that aligns opposite edges of CLK and CLKB, to generate CLK1 and CLK2, which are gated in lieu of CLKB and CLK, to generate the gated differential clock signal.

Figure 7:
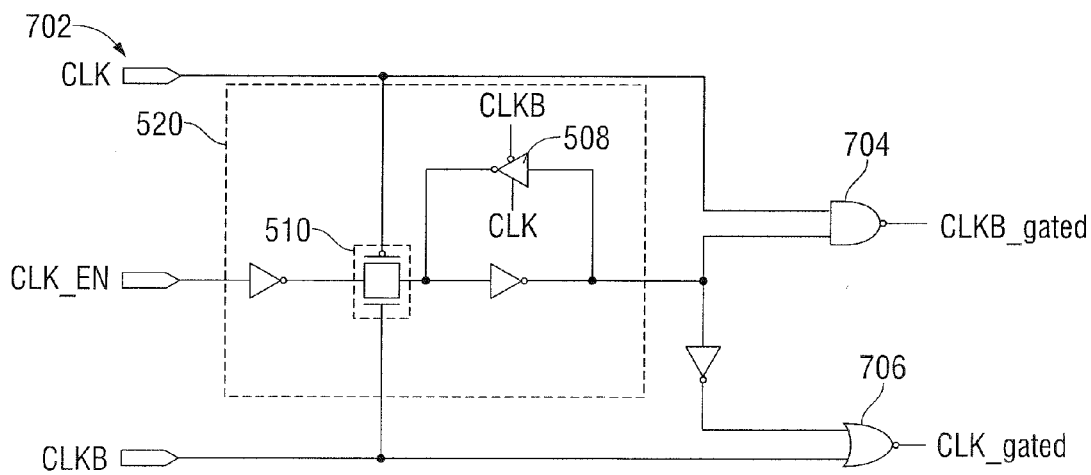
FIG. 7 illustrates a circuit diagram of a differential clock gater circuit consistent with at least one embodiment of the invention.
Figure 8:
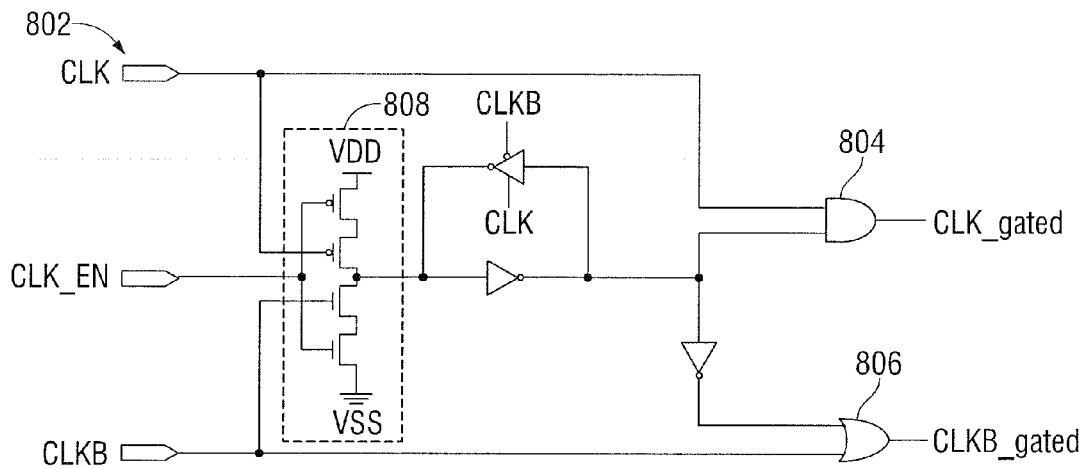
FIG. 8 illustrates a circuit diagram of a differential clock gater circuit consistent with at least one embodiment of the invention.
Figure 9:
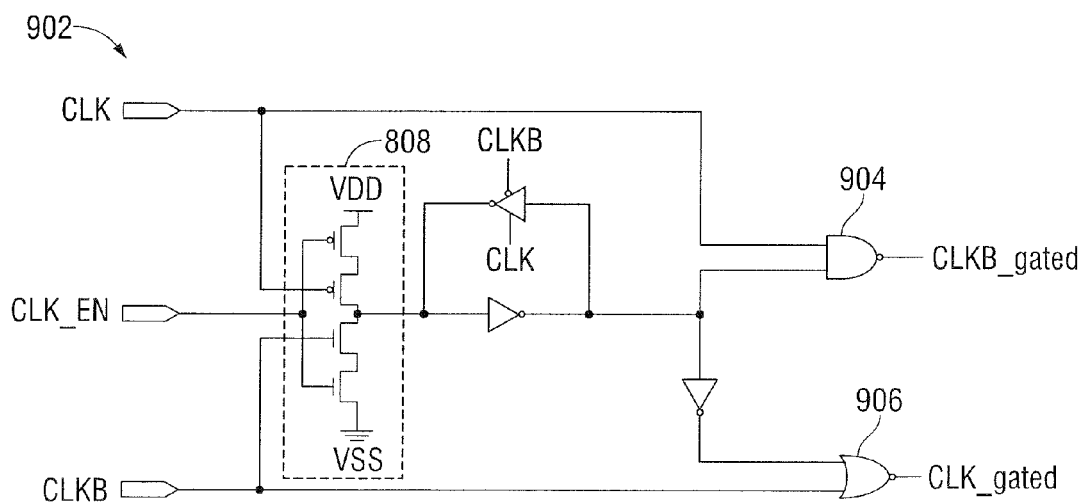
FIG. 9 illustrates a circuit diagram of a differential clock gater circuit consistent with at least one embodiment of the invention.

In at least one embodiment of a differential clock gater, other combinatorial logic circuit configurations (i.e., digital logic implemented by Boolean circuits having an output that is a function of present input only) may be used. Referring to FIG. 7, output NAND 704 and output NOR 706 may be used in lieu of the output combinatorial logic of FIGS. 5 and 6, and generate CLKB_gated and CLK_gated on complementary output lines. In addition, rather than use a standard cell inverter circuit coupled to transmission gate 510 of FIG. 5, other circuit elements may be used. For example, referring to FIG. 8, clock gater 802 includes a tri-state inverter cell 808 selectively passes a version of CLK_EN to cross-coupled inverters. The variations described above with respect to FIGS. 6-8 may be used in various different combinations consistent with the techniques described herein. For example, FIG. 9 illustrates clock gater 902 that combines the variations of FIG. 7 and FIG. 8.

Although the storage elements in differential clock gaters illustrated herein use an inverter cross-coupled with a tri-state inverter, other embodiments of clock gater circuits consistent with the disclosure herein implement the storage element using other cross-coupled standard logic devices (e.g., cross-coupled AND gates, OR gates, NAND gates, or NOR gates), although such embodiments may use more transistors, occupy greater area, and dissipate more power than the embodiments of FIGS. 5-9.

Note that each of the embodiments of differential clock gater circuits described above may be used in a non-inverting clock gater cell or in an inverting gater cell by swapping the output ports, CLK_gated and CLKB_gated, accordingly. Thus, the differential clock gating techniques described herein provide flexibility that is useful in designs (e.g., designs having half-cycle paths) that invert the clock phases in one of the clock distribution paths yet maintain the same insertion delay to reduce or eliminate clock skew across all paths of the clock distribution network.

Figure 10:
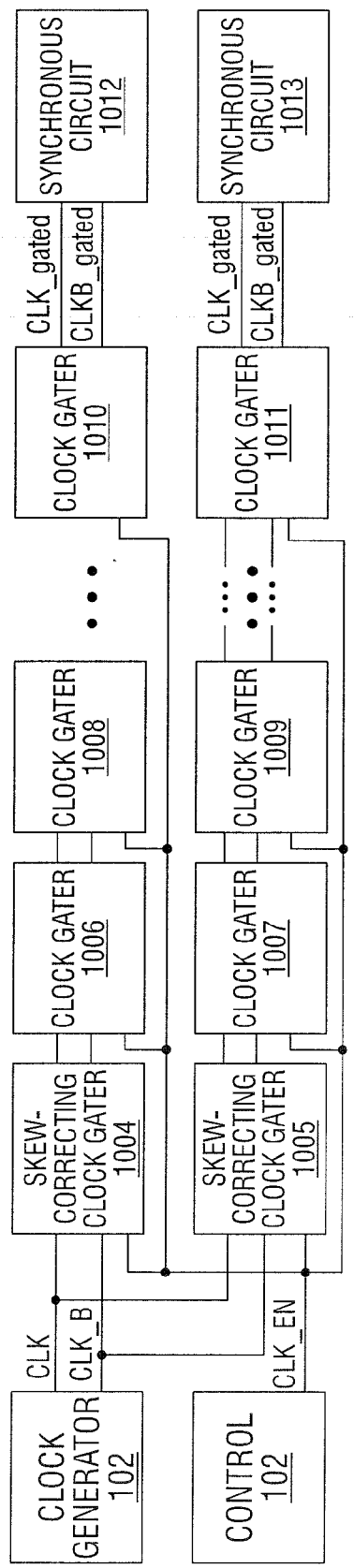
FIG. 10 illustrates a functional block diagram of an exemplary integrated circuit clock distribution network consistent with at least one embodiment of the invention.

Referring to FIG. 10, an exemplary clock distribution network implements differential clock gater circuits consistent with the techniques described above. The clock distribution network includes a skew-correcting differential clock gating circuit (e.g., skew-correcting differential clock gating circuit 1004 or skew-correcting differential clock gating circuit 1005) coupled to a plurality of differential clock gater circuits cascaded in series (e.g., differential clock gater circuits 1006, 1008, and 1010 or differential clock gater circuits 1007, 1009, and 1011). The first differential clock gating circuit of the plurality of differential clock gating circuits (e.g., differential clock gater circuit 1006 or differential clock gater circuit 1007) is coupled to the output of the skew correcting differential clock gating circuit. The last differential clock gating circuit of the plurality of differential clock gating circuits (e.g., differential clock gater circuit or differential clock gater circuit 1011) may be coupled to a differential synchronous circuit (e.g., differential synchronous circuit 1012 or differential synchronous circuit 1013) or another skew-correcting differential clock gating circuit. The differential synchronous circuit may be a current mode logic circuit. The skew-correcting differential clock gating circuit is an embodiment of the differential clock gating circuit including the edge alignment circuit 608 of FIG. 6, while the plurality of differential clock gater circuits cascaded in series of FIG. 10 are embodiments of the differential clock gating circuit that may exclude the edge alignment circuit 608 of FIG. 6.

Although FIGS. 5-9 illustrate embodiments of differential clock gater circuits that receive a clock enable signal on a clock control terminal, CLK_EN, one of skill in the art will appreciate that other embodiments of differential clock gater circuits 502, 602, 702, 802, and 902 consistent with the teachings herein receive a complementary signal (e.g., CLK_ENB) on the clock control terminal. For example, the inverter coupled to the CLK_EN port may be excluded or replaced with a non-inverting buffer if the clock control signal on the CLK_EN node receives the complementary signal, CLK_ENB. In other embodiments of differential clock gater circuits 502, 602, 702, 802, and 902, the output combinatorial logic is modified to generate output CLK_GATED and CLKB_GATED consistent with Table 2 instead of modifying the input inverter.

TABLE 2

Clock Gater Logic Responsive to Complementary Clock Control Signal

| CLKB_EN | CLK | CLKB | CLK_GATED | CLKB_GATED |
|---|---|---|---|---|
| 0 | 1 | 0 | 1 | 0 |
| 0 | 0 | 1 | 0 | 1 |
| 1 | 1 | 0 | 0 | 1 |
| 1 | 0 | 1 | 0 | 1 |

For example, AND gates 504, 604, and 804 of clock gater circuits 502, 602, and 802 may be replaced with NOR gates and OR gates 506, 606, and 806 may be replaced with NAND gates to generate CLK_gated and CLKB_gated in response to receiving CLK_ENB on the clock control signal terminal. Similarly, NAND gates 704 and 904 may be replaced with OR gates, and NOR gates 706 and 906 may be replaced with AND gates to generate CLK_gated and CLK-B_gated in response to receiving CLK_ENB on the clock control signal terminal of clock gater circuits 702 and 902, respectively. Note that yet other embodiments of differential clock gater circuits 502, 602, 702, 802, and 902 use different combinatorial logic in the clock control signal path to generate CLK_GATED and CLKB_GATED in response to receiving CLK_EN or CLK_ENB as the clock control signal.

The differential clock gater described above with reference to FIGS. 5-9 may be embodied as a standard cell that may be represented in the form of a transistor netlist or schematic having nodal description of transistors, their connections to each other, and of their terminals to the external environment. The netlist may be used to simulate electronic behavior of the standard cell, including time domain response (e.g., functional, power consumption, and signal propagation delay) based on input stimuli (e.g., voltage or current). A corresponding physical representation (e.g., layout) may be used to manufacture the associated integrated circuit. The physical representation includes a description of base layers that correspond to different structures of transistor devices, and interconnect wiring and via layers, which join together those transistor structures. The schematic view may be generated with any suitable computer aided design or electronic design automation tool. The standard cell typically has an associated layout, timing model (e.g., Spice model), functional model (e.g., Verilog or VHDL model used to simulate functional behavior), parasitic extraction model (e.g., used to simulate analog behavior), and design rule deck. Those models specify function, timing, and geometric and connectivity restrictions, which ensure sufficient margins to account for variability in semiconductor manufacturing processes and ensure the manufactured part operates correctly.

Thus, a differential clock-gater suitable for use as a standard cell in a standard cell library for synthesized integrated circuits has been described. The differential clock gater is compact and reduces power consumption and area as compared to designs including separate clock gaters for each phase of a clock signal in a differential clock routing network. The description of the invention set forth herein is illustrative, and is not intended to limit the scope of the invention as set forth in the following claims. For example, while the invention has been described in an embodiment in which a differential clock signals are gated, one of skill in the art will appreciate that the teachings herein can be utilized with other differential control signals. Variations and modifications of the embodiments disclosed herein, may be made based on the description set forth herein, without departing from the scope and spirit of the invention as set forth in the following claims.

What is claimed is:

1. An apparatus comprising:
a first terminal configured to receive a clock signal;
a second terminal configured to receive a complementary clock signal;
a third terminal configured to receive a clock control signal;
a latch circuit configured to generate a latched version of the clock control signal based on a version of the clock control signal, a version of the clock signal, and a version of the complementary clock signal; and
a combinatorial circuit configured to generate a gated clock signal and a gated complementary clock signal based on the latched version of the clock control signal, the version of the clock signal, and the version of the complementary clock signal, wherein in response to the clock control signal having a first level, the combinatorial circuit generates the gated clock signal having a low level and the gated complementary clock signal having a high level.

2. The apparatus, as recited in claim 1, wherein the latch circuit comprises:
a selective pass circuit configured to pass the version of the clock control signal based on the version of the clock signal and the version of the complementary clock signal.

3. The apparatus, as recited in claim 2, wherein the selective pass circuit comprises:
a transmission gate configured to pass an inverted version of the clock control signal in response to the version of the clock signal and the version of the complementary clock signal.

4. The apparatus, as recited in claim 1, wherein the clock control signal is a clock enable signal and the first level is the low level.

5. The apparatus, as recited in claim 1, wherein the clock signal and the complementary clock signal form a differential clock signal and the apparatus further comprises a current mode logic circuit coupled to the differential clock signal.

6. The apparatus, as recited in claim 1, wherein the latch circuit comprises:
a tri-state inverter configured to generate an inverted version of the clock control signal in response to the clock control signal, the version of the clock signal, and the version of the complementary clock signal.

7. The apparatus, as recited in claim 1, wherein the version of the clock signal and the version of the complementary clock signal are the same as the clock signal and the complementary clock signal, respectively.

8. The apparatus, as recited in claim 1, further comprising:
an edge-alignment circuit configured to generate the version of the clock signal and the version of the complementary clock signal based on the clock signal and the complementary clock signal, wherein opposite edges of the version of the clock signal and the version of the complementary clock signal are aligned.

9. The apparatus, as recited in claim 8, wherein the edge-alignment circuit comprises a pair of cross-coupled inverters.

10. The apparatus, as recited in claim 1, embodied in computer-readable descriptive form of a standard cell.

11. The apparatus, as recited in claim 1, wherein opposite edges of the version of the clock signal and the version of the complementary clock signal are aligned.

12. A method comprising:
receiving a clock signal;
receiving a complementary clock signal;
receiving a clock control signal;
selectively passing a version of the clock control signal according to a version of the clock signal and a version of the complementary clock signal;
generating a latched version of the clock control signal based on the version of the clock control signal, the version of the clock signal, and the version of the complementary clock signal; and
generating a gated clock signal and a gated complementary clock signal based on the latched version of the clock control signal, the version of the clock signal, and the version of the complementary clock signal, wherein in response to the clock control signal having a first level, the gated clock signal is generated to have a low level and the gated complementary clock signal is generated to have a high level.

13. The method, as recited in claim 12, wherein the clock control signal is a clock enable signal and the first level is the low level.

14. The method, as recited in claim 12, further comprising:
generating the version of the clock signal and the version of the complementary clock signal based on the clock signal and the complementary clock signal, wherein opposite edges of the version of the clock signal and the version of the complementary clock signal are aligned.

15. The method, as recited in claim 12, further comprising:
differentially controlling a digital logic circuit according to the version of the clock signal and the version of the complementary clock signal.

16. The method, as recited in claim 12, further comprising:
routing the gated clock signal and the gated complementary clock signal to generate a routed clock signal and a routed complementary clock signal; and
generating a gated version of the routed clock signal and a gated version of the routed complementary clock signal.

17. An apparatus comprising:
a skew-correcting differential clock gating circuit; and
a plurality of differential clock gating circuits cascaded in series, a first differential clock gating circuit of the plurality of differential clock gating circuits being coupled to an output of the skew-correcting differential clock gating circuit.

18. The apparatus, as recited in claim 17, further comprising:
an additional skew-correcting differential clock gating circuit coupled to an output of a last differential clock gating circuit of the plurality of differential clock gating circuits.

19. The apparatus, as recited in claim 17, further comprising:
a current mode logic circuit coupled to an output of a last differential clock gating circuit of the plurality of differential clock gating circuits.

20. The apparatus, as recited in claim 17, wherein the skew-correcting differential clock gating circuit comprises:
a first terminal configured to receive a clock signal;
a second terminal configured to receive a complementary clock signal;
a third terminal configured to receive a clock control signal;
an edge-alignment circuit configured to generate a version of the clock signal and a version of the complementary clock signal based on the clock signal and the complementary clock signal, wherein opposite edges of the version of the clock signal and the version of the complementary clock signal are aligned;
a selective pass circuit configured to pass a version of the clock control signal based on the version of the clock signal and the version of the complementary clock signal;
a latch circuit configured to generate a latched version of the clock control signal based on the clock control signal, the version of the clock signal, and the version of the complementary clock signal; and
a combinatorial circuit configured to generate a gated clock signal and a gated complementary clock signal based on the version of the clock control signal, the latched version of the clock signal, and the version of the complementary clock signal.

21. The apparatus, as recited in claim 17, wherein the differential clock gating circuit comprises:
a first terminal configured to receive a clock signal;
a second terminal configured to receive a complementary clock signal;
a third terminal configured to receive a clock control signal;
a selective pass circuit configured to pass an inverted version of the clock control signal based on a version of the clock signal and a version of the complementary clock signal;
a latch circuit configured to generate a latched version of the clock control signal based on the inverted version of the clock control signal, the version of the clock signal, and the version of the complementary clock signal; and
a combinatorial circuit configured to generate a gated clock signal and a gated complementary clock signal based on the version of the clock control signal, the version of the clock signal, and the version of the complementary clock signal.

* * * * *

UNITED STATES PATENT AND TRADEMARK OFFICE
CERTIFICATE OF CORRECTION

PATENT NO. : 9,625,938 B2  
APPLICATION NO. : 14/668183  
DATED : April 18, 2017  
INVENTOR(S) : Hariprasad Thodukattil Thazhatheppattu et al.

Page 1 of 1

It is certified that error appears in the above-identified patent and that said Letters Patent is hereby corrected as shown below:

In the Specification

In Column 6, Line 49 (Table 2), please replace "CLKB_EN" with --CLK_ENB--

Signed and Sealed this
Thirteenth Day of June, 2017

Joseph Matal
*Performing the Functions and Duties of the*
*Under Secretary of Commerce for Intellectual Property and*
*Director of the United States Patent and Trademark Office*